United States Patent [19]

Tietz

[11] 4,045,689
[45] Aug. 30, 1977

[54] CIRCUIT FOR SQUARING THE TRANSFER CHARACTERISTICS OF A TTL GATE

[75] Inventor: Gary W. Tietz, San Jose, Calif.

[73] Assignee: National Semiconductor Corporation, Santa Clara, Calif.

[21] Appl. No.: 691,934

[22] Filed: June 1, 1976

[51] Int. Cl.² .................................................. H03K 19/34
[52] U.S. Cl. .................................... 307/254; 307/214; 307/270
[58] Field of Search ............................. 307/214–218, 307/254, 296, 270

[56] References Cited

U.S. PATENT DOCUMENTS 3,699,355  10/1972  Madrazo et al. .................. 307/215
3,867,644  2/1975  Cline ................................. 307/215
3,958,136  5/1976  Schroeder ......................... 307/214

Primary Examiner—Stanley D. Miller, Jr.
Assistant Examiner—B. P. Davis
Attorney, Agent, or Firm—Gail W. Woodward; Willis E. Higgins

[57] ABSTRACT

A TTL gate circuit is provided with an additional transistor biased by the base of the input transistor. This additional transistor supplies current to the phase splitter emitter load, to thereby bias the phase splitter transistor off until the input voltage is high enough to turn both the phase splitter transistor and the output transistor on. The result is a substantially square voltage transfer characteristic.

7 Claims, 3 Drawing Figures

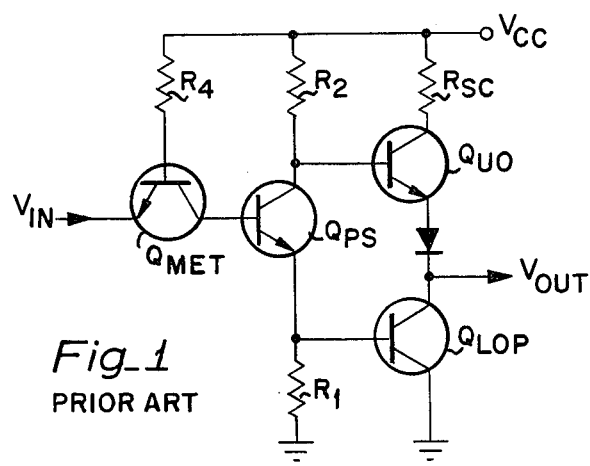
*Fig_1*
PRIOR ART
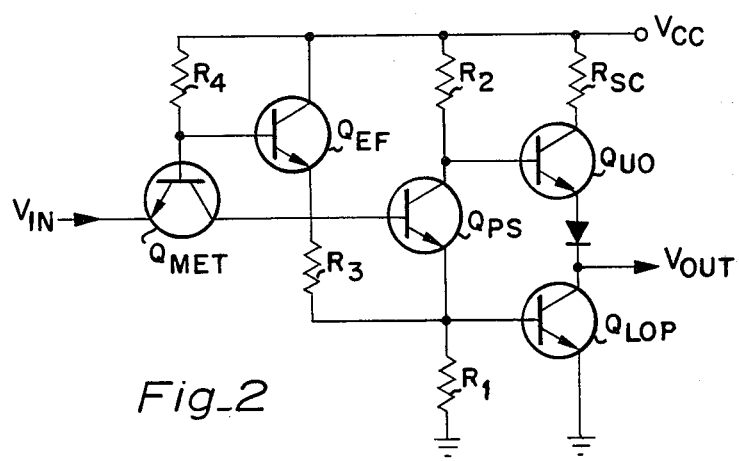
*Fig_2*
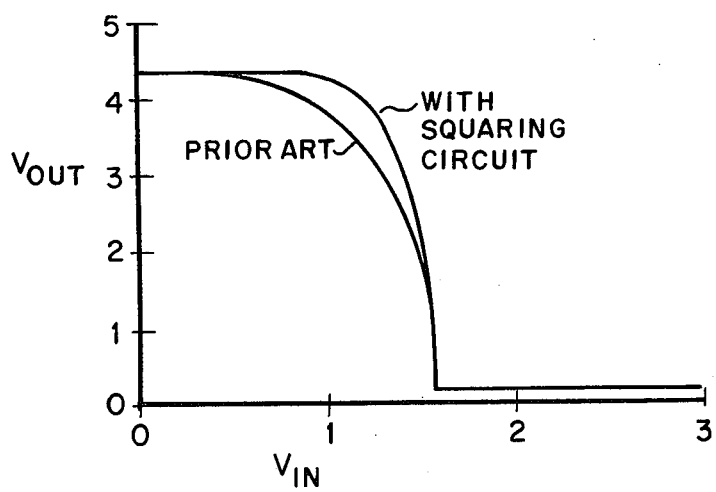
*Fig_3*

CIRCUIT FOR SQUARING THE TRANSFER CHARACTERISTICS OF A TTL GATE

This invention relates to integrated circuit logic devices and, more particularly, to a transistor switching circuit for switching from a high level voltage to a low level.

A standard transistor-transistor logic (TTL) gate is comprised of an input transistor which drives a phase splitter, the two outputs of which drive two output transistors which are joined together emitter to collector. An output voltage is taken at the junction. The transfer characteristic of this prior circuit does not switch immediately, but instead exhibits an undesirable slope near the point where the transition first starts to take place. The voltage initially drops to some intermediate level at a slope which is proportional to the ratio between the collector and emitter resistors of the phase splitter.

The prior art attempted to square off the voltage transfer characteristic by providing an active circuit pull-down at the base of the phase splitter transistor. This design suffers from the disadvantage that if the pull-down transistor is not matched with the output transistor, the active pull-down will increase propagation delays in the circuit.

It is therefore an object of this invention to provide a TTL gate with a square transfer characteristic and a resistive pull-down.

Briefly, the above object is accomplished in accordance with the invention by providing a transistor/resistor combination which is biased by the input transistor of a TTL gate to act as a current source for the emitter load resistor of the TTL circuit phase splitter.

The circuit has the advantage that the additional transistor is fabricated in the VCC tank along with the other resistors, so that in fabricating an integrated circuit a small die size can be used.

Additionally, since the base of the additional transistor is connected directly to the input resistor, the resistor can terminate directly into the base of the additional transistor and does not require a metal contact.

The circuit has the further advantage that it is easy to manufacture because only the inactive components, i.e., the additional resistor, need be matched with the other circuit elements of the TTL gate. This is an advantage over the prior art circuit which, by utilizing an active pull-down circuit, relied on matching the geometry of the active pull-down transistor with the output transistor of the TTL gate.

The foregoing and other objects, features and advantages of the invention will be apparent from the following more particular description of a preferred embodiment of the invention, as illustrated in the accompanying drawings.

IN THE DRAWINGS

FIG. 1 is a circuit diagram of a prior art TTL gate;

FIG. 2 is a circuit diagram of a TTL gate modified in accordance with Applicant's invention; and FIG. 3 is a voltage waveform diagram illustrating circuit response characteristics with and without Applicant's invention.

DESCRIPTION OF THE PREFERRED EMBODIMENT

Referring now to FIG. 1, when $V_{in}$ is at zero volts, the collector of $Q_{met}$ is approximately 0.2 volts. Thus, the transistor $Q_{ps}$ is turned off and its output collector is at $V_{cc}$. $V_{out}$ is therefore at approximately VCC minus 1.5 volts. When $V_{in}$ rises to 0.6 volts, the collector of $Q_{met}$ will rise to about 0.8 volts which starts to turn on transistor $Q_{ps}$. This starts to draw current through the collector which pulls the current through resistor $R_2$ causing the collector of $Q_{ps}$ to drop in voltage. In turn, $V_{out}$ starts to drop. As the input voltage continues to rise, current is drawn through $R_1$ and that current is coming through resistor $R_2$. Therefore, the turn-on slope of the transfer characteristic at this point is $R_2$ divided by $R_1$. When the input voltage gets high enough, and the collector of $Q_{met}$ is equal to approximately 1.4 volts, there is enough voltage to turn on both $Q_{ps}$ and $Q_{lop}$ which causes the gate to change state completely and the output voltage drops down to 0.2 volts.

As shown in FIG. 3, there is a slope to the prior art transfer characteristic between approximately 0.5 volts and 1.3 volts.

This slope is an undesirable characteristic because it tends to hurt the noise immunity of the circuit since, for a given input voltage, the output voltage is not as high as it should be.

Referring now to FIG. 2, Applicant's invention will be described. The circuit of FIG. 2 is identical to the circuit of FIG. 1 with the addition of a transistor $Q_{ef}$ whose base is connected to the base of input transistor $Q_{met}$ and whose collector is connected to supply voltage $V_{cc}$. The emitter of $Q_{ef}$ is connected to a resistor $R_3$ which is connected to the emitter of the phase splitter $Q_{ps}$.

In operation, when the voltage input rises to about 1.2 volts, the base of $Q_{met}$ is at approximately 1.9 volts, which causes the emitter of transistor $Q_{ef}$ to be at approximately 1.2 volts. The collector of $Q_{met}$ is at approximately 1.4 volts which causes the emitter of $Q_{ps}$ to be at approximately 0.7 volts. Since there is a voltage of 0.7 volts across the resistor $R_1$, there is a current flowing through $R_1$. Since resistor $R_3$ is connected to $R_1$ and it has 0.5 volts across it, most of the current supplied to $R_1$ will be supplied through resistor $R_3$ rather than from the phase splitter. Once the input voltage has reached a threshold point, both $Q_{ps}$ and $Q_{lop}$ turn on and clamp the base of $Q_{met}$ to approximately 2.1 volts which means that the current supplied through $R_3$ will be constant from there on. All the rest of the current will then come out of the phase splitter $Q_{ps}$ and the end result is the square transfer characteristic shown in FIG. 3. In summary, the current rather than being supplied by $Q_{ps}$ to the resistor $R_1$ is supplied through resistor $R_3$ by the transistor action of $Q_{ef}$, and if $R_1$ and $R_3$ are made approximately equal in value the transfer characteristic is substantially square.

What is claimed is:

1. In a transistor switching gate having an input stage responsive to an input voltage, which input stage drives a phase splitter, two outputs of which phase splitter drive the bases of two output transistors joined together to derive an output voltage at the junction therebetween, the improvement for obtaining a relatively square transfer voltage characteristic at said output comprising:

an additional transistor connected as an emitter follower with its input coupled to said input stage and its output coupled to said phase splitter for supplying current to said phase splitter to thereby bias said phase splitter off until said input voltage is high enough to turn on both said phase plitter and said output stage to thereby result in a substantially square voltage transfer characteristic.

2. The combination in accordance with claim 1 wherein said phase splitter is comprised of a transistor with a collector load first resistor for deriving one of said two outputs, and an emitter load second resistor for deriving the other of said two outputs, and wherein said additional transistor has its emitter connected through a third resistor to the emitter of said phase splitter transistor.

3. The combination in accordance with claim 2 wherein the size of said third resistor with respect to said second resistor is of such a value as to achieve a substantially square output voltage transfer characteristic.

4. In a transistor switching gate having an input transistor, the emitter of which is responsive to an input voltage and the output collector of which drives a phase splitter, two outputs of which phase splitter drive the bases of two output transistors joined emitter to collector to derive an output voltage at the junction therebetween, the improvement for obtaining a relatively square transfer voltage characteristic at said output comprising:

an additional transistor with its base coupled to the base of said input transistor and its emitter coupled through a first load to said phase splitter for supplying current to said phase splitter to thereby bias said phase splitter off until said input voltage is high enough to turn on both said phase splitter and said output stage to thereby result in a substantially square voltage transfer characteristic.

5. The combination in accordance with claim 4 wherein said phase splitter is comprised of a transistor with its collector coupled to a second load, and its emitter coupled to a third load, and wherein said first load is coupled to the emitter of said phase splitter transistor.

6. The combination in accordance with claim 5 wherein the size of said first load with respect to said third load is of such a value as to achieve a substantially square output voltage transfer characteristic.

7. A gate circuit comprising:
a first transistor having a first emitter for receiving input gating signals, a first base, and a first collector;
a second transistor having a second base coupled to said first collector, a second collector for developing a first switching signal and a second emitter for developing a second switching signal across an emitter load;
a third transistor having a third base coupled to the collector of the second transistor;
a fourth transistor having a fourth base and connected in series with said third transistor for developing an output signal at the junction between said transistors; and
a fifth transistor coupled to said first transistor and the emitter load of said second transistor to thereby provide a current source for said emitter load during the initial switching of said second transistor until the input voltage is of a high enough value to turn on both said second transistor and said fourth transistor;
whereby, said second switching signal has its current supplied by said fifth transistor until said second transistor reaches a threshold at which point said second transistor supplies said load current.

* * * * *